(12) United States Patent
Aude

(10) Patent No.: US 6,445,250 B1
(45) Date of Patent: *Sep. 3, 2002

(54) CIRCUIT TOPOLOGY FOR BETTER SUPPLY IMMUNITY IN A CASCADED $G_M/G_M$ AMPLIFIER

(75) Inventor: Arlo J. Aude, Atlanta, GA (US)

(73) Assignee: National Semiconductor Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/569,829

(22) Filed: May 12, 2000

(51) Int. Cl.[7] ................................................ H03F 3/45
(52) U.S. Cl. ...................................... 330/253; 330/310
(58) Field of Search .................................. 330/253, 310, 330/311, 300; 11/257

(56) References Cited

U.S. PATENT DOCUMENTS

| | | | | |
|---|---|---|---|---|
| 5,440,271 A | * | 8/1995 | Laws | 330/310 |
| 5,635,880 A | * | 6/1997 | Brown | 330/253 |
| 5,838,197 A | * | 11/1998 | Tsukuda | 330/252 |
| 5,900,781 A | * | 5/1999 | Igarashi et al. | 330/310 |
| 6,208,205 B1 | * | 3/2001 | Main et al. | 330/310 |

* cited by examiner

Primary Examiner—Robert Pascal
Assistant Examiner—Khanh Van Nguyen

(57) ABSTRACT

There is disclosed an amplifier comprising: 1) a plurality of cascaded NMOS differential amplifier stages, wherein a first one of the plurality of cascaded NMOS differential amplifier stages is coupled to at least one input signal; 2) a PMOS differential amplifier stage having a first input coupled to a first NMOS differential output of a last one of the plurality of cascaded NMOS differential amplifier stages and a second input coupled to a second NMOS differential output of the last cascaded NMOS differential amplifier stage, wherein the PMOS differential amplifier comprises a first diode-connected PMOS load transistor having a gate and a drain connected to ground and a second diode-connected PMOS load transistor having a gate and a drain connected to ground; and 3) an output differential amplifier stage comprising: a) load transistors comprising a third PMOS transistor having a gate and a drain connected together and a source connected to a power supply rail and a fourth PMOS transistor having a gate coupled to the third PMOS transistor gate and a source connected to the power supply rail; and b) a differential transistors pair comprising a first NMOS transistor having a gate coupled to a source of the first diode-connected PMOS load transistor and a drain coupled to a drain of the third PMOS transistor and a second NMOS transistor having a gate coupled to a source of the second diode-connected PMOS load transistor and a drain coupled to a drain of the fourth PMOS transistor.

12 Claims, 1 Drawing Sheet

CIRCUIT TOPOLOGY FOR BETTER SUPPLY IMMUNITY IN A CASCADED $G_M/G_M$ AMPLIFIER

TECHNICAL FIELD OF THE INVENTION

The present invention is generally directed to amplifier circuits and, more specifically, to a cascaded amplifier having better immunity to power supply noise and absolute supply level.

BACKGROUND OF THE INVENTION

Signal amplifiers are used in a very wide range of electronic devices to boost the power of a signal, usually for transmission or reception purposes. Signal amplifiers are frequently implemented as integrated circuits that are used in wireless phones, radios, televisions, network cards, and the like. One very common type of signal amplifier is the cascaded current gain ($G_{m1}/G_{m2}$) amplifier.

A cascaded $G_{m1}/G_{m2}$ amplifier typically contains several NMOS differential amplifier stages cascaded in series. Each NMOS stage comprises n-type metal-oxide-silicon (NMOS) transistors used as loads and a differential pair of NMOS transistors. At the end of a series of M cascaded NMOS differential amplifier stages, there is typically a simple differential amplifier with an NMOS differential pair and p-type MOS (PMOS) loads. The advantage of this type of amplifier configuration is very high gain and a wide bandwidth with a large output compliance under most conditions.

Unfortunately, under some conditions, this type of configuration has a disadvantage in that the power supply limits directly affect the output compliance range. As the positive supply voltage changes, the sources of the NMOS load devices in the last $G_{m1}/G_{m2}$ amplifier track the change. The DC bias voltage on the NMOS differential pair in the last stage are subject to large voltage swings directly caused by supply voltage changes. This is a disadvantage in that the supply limits directly affect the output compliance range.

There is therefore a need in the art for signal amplifiers having very high gain, wide bandwidth, and a large output compliance even under less than ideal conditions. In particular, there is a need for an improved cascaded $G_{m1}/G_{m2}$ amplifier containing M cascaded NMOS differential amplifier stages that has better immunity to changes in the supply voltage.

SUMMARY OF THE INVENTION

To address the above-discussed deficiencies of the prior art, it is a primary object of the present invention to provide an amplifier comprising: 1) a plurality of cascaded NMOS differential amplifier stages, wherein a first one of the plurality of cascaded NMOS differential amplifier stages is coupled to at least one input signal; 2) a PMOS differential amplifier stage having a first input coupled to a first NMOS differential output of a last one of the plurality of cascaded NMOS differential amplifier stages and a second input coupled to a second NMOS differential output of the last cascaded NMOS differential amplifier stage, wherein the PMOS differential amplifier comprises a first diode-connected PMOS load transistor having a gate and a drain connected to ground and a second diode-connected PMOS load transistor having a gate and a drain connected to ground; and 3) an output differential amplifier stage comprising: a) load transistors comprising a third PMOS transistor having a gate and a drain connected together and a source connected to a power supply rail and a fourth PMOS transistor having a gate coupled to the third PMOS transistor gate and a source connected to the power supply rail; and b) a differential transistor pair comprising a first NMOS transistor having a gate coupled to a source of the first diode-connected PMOS load transistor and a drain coupled to a drain of the third PMOS transistor and a second NMOS transistor having a gate coupled to a source of the second diode-connected PMOS load transistor and a drain coupled to a drain of the fourth PMOS transistor.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OR THE INVENTION

Figure 1:
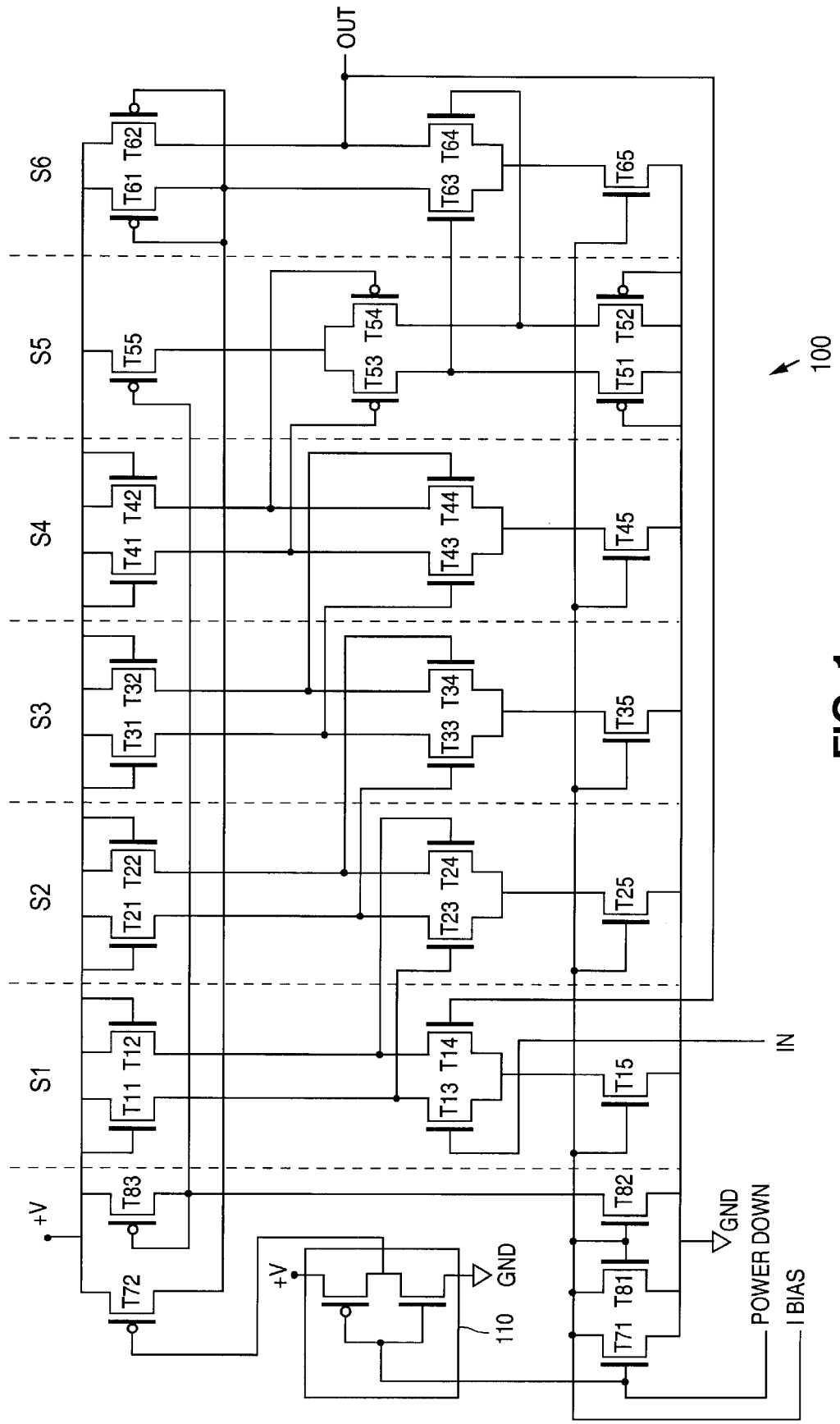
FIG. 1 illustrates an exemplary cascaded $G_{m1}/G_{m2}$ amplifier according to the principles of the present invention.

FIG. 1, discussed below, and the embodiment used to describe the principles of the present invention in this patent document are by way of illustration only and should not be construed in any way to limit the scope of the invention. Those skilled in the art will understand that the principles of the present invention may be implemented in any suitably arranged amplifier.

FIG. 1 illustrates exemplary cascaded $G_{m1}/G_{m2}$ amplifier 100 according to the principles of the present invention.

Amplifier 100 is a buffer that receives an input signal (IN) on the gate of NMOS transistor 13 (T13) and generates a buffered signal on the node where the drain of NMOS transistor 64 (T64) is coupled to the drain of PMOS transistor 62 (T62). Amplifier 100 also receives a POWER DOWN signal that is applied to the gate of NMOS transistor 71 (T71) and a current bias (I BIAS) signal that is applied to the gates of NMOS transistors 81 and 82 (T81 and T82), among others.

Amplifier 100 comprises four (M=4) NMOS differential amplifier stages (labeled "S1," "S2," "S3," and "S4") cascaded in series. The four NMOS stages are by way of illustration only. In alternate embodiments of the present invention, amplifier 100 may contain more than four or less than four NMOS amplifier stages. Unlike prior art amplifiers, however, amplifier 100 also comprises a PMOS differential amplifier stage (labeled "S5") that connects the final NMOS differential amplifier stage (i.e., S4) to the output stage, which is a simple differential amplifier stage containing an NMOS differential pair and PMOS loads.

NMOS differential amplifier stage S1 comprises five NMOS transistors, labeled T11, T12, T13, T14, and T15. Transistors T11 and T12 are connected to the positive supply rail as NMOS loads. Transistors T13 and T14 form a differential amplifier pair. Transistor T15 is a current reference source for NMOS differential amplifier stage S1.

Similarly, NMOS differential amplifier stage S2 comprises five NMOS transistors, labeled T21, T22, T23, T24, and T25. Transistors T21 and T22 are connected to the positive supply rail as NMOS loads. Transistors T23 and T24 form a differential amplifier pair. Transistor T25 is a current reference source for NMOS differential amplifier stage S2.

Likewise, NMOS differential amplifier stage S3 comprises five NMOS transistors, labeled T31, T32, T33, T34, and T35. Transistors T31 and T32 are connected to the positive supply rail as NMOS loads. Transistors T33 and T34 form a differential amplifier pair. Transistor T35 is a current reference source for NMOS differential amplifier stage S3.

Finally, NMOS differential amplifier stage S4 comprises five NMOS transistors, labeled T41, T42, T43, T44, and T45. Transistors T41 and T42 are connected to the positive supply rail as NMOS loads. Transistors T43 and T44 form a differential amplifier pair. Transistor T45 is a current reference source for NMOS differential amplifier stage S4.

The amplifier stage before the output stage, namely stage S5, is unique to the present invention. PMOS differential amplifier stage S5 comprises five PMOS transistors, labeled T51, T52, T53, T54, and T55. Transistors T51 and T52 are connected to the ground rail as PMOS loads. Transistors T53 and T54 form a differential amplifier pair. Transistor T55 is a current reference source for PMOS differential amplifier stage S5.

The output stage of amplifier 100 is simple differential amplifier stage S6 containing five transistors: PMOS load transistors T61 and T62, NMOS differential pair transistors T63 and T64, and NMOS transistor T65, which is a current reference source for simple differential amplifier stage S6.

NMOS transistors T81 and T82 form a current mirror controlled by the current bias signal, I BIAS. Transistor T81 is diode connected (i.e., T81 gate and drain are connected together) so that the I BIAS current is the drain current of transistor T81. Because transistors T81 and T82 are matched transistors with the same gate-to-source voltage, Vgs, the drain current in transistor T82 is always equal to the drain current in transistor T81, namely I BIAS. Transistor T83 also is diode connected (i.e., T83 gate and drain are connected together). The drain-to-source current of transistor T83 is also I BIAS, the drain current of transistor T82.

Additionally, the gates of NMOS transistors T15, T25, T35, T45 and T65 are all connected to the gates of NMOS transistors T81 and T82, so that all of these NMOS transistors have the same gate-to-source voltage, Vgs. Assuming that T15, T25, T35, T45 and T65 are matched to transistor T81, the reference currents in stages S1–S4 and S6 (i.e., the drain currents of T15, T25, T35, T45 and T65) are equal to the drain current in transistor T81, namely I BIAS.

Similarly, the gate of PMOS transistor T55 is connected to the gate of PMOS transistor T83, so that transistors T83 and T55 have the same gate-to-source voltage, Vgs. If T83 and T55 are matched transistors, the reference current in stage S5 (i.e., the drain current of T15) is equal to the drain current in transistor T83, namely I BIAS. However, the current in transistor T55 can be amplified with respect to the current in transistor T83 by scaling the relative width-to-length ratios of transistors T55 and T83. For example, if the W/L ratio of transistor T55 is five times the W/L ratio of transistor T83, then the drain-to-source current in transistor T55 is five times the drain-to-source current in transistor T83, or 5(I BIAS).

NMOS transistor T71, CMOS inverter 110 and PMOS transistor T72 comprise a kill switch that is used to power down amplifier 100. When POWER DOWN signal is Logic 0, the gate-to-source voltage, Vgs, of transistor T71 is 0 volts, so that transistor T71 is OFF. At the same time, POWER DOWN is inverted by CMOS inverter 110, so that a Logic 1 (+V) is applied to the gate of transistor T72. This make the gate-to-source voltage, Vgs, of transistor T72 equal to 0 volts and transistor T72 is OFF.

However, when POWER DOWN signal is Logic 1, the gate-to-source voltage, Vgs, of transistor T71 is high, so that transistor T71 is ON. This essentially shorts the drain of T71 to ground, thereby grounding the gates of transistors T81, T82, T15, T25, T35, T45 and T65. This shuts off the reference current sources in stages S1–S4 and S6.

At the same time, POWER DOWN is inverted by CMOS inverter 110, so that a Logic 0 (0V) is applied to the gate of transistor T72. This make the gate-to-source voltage, Vgs, of transistor T72 equal to +V volts and transistor T72 is ON. This essentially shorts the drain of T72 to the +V supply rail. This in turn shorts the gates of transistors T61 and T62 to the +V supply rail, so that the gate-to-source voltages, Vgs, of transistors T61 and T62 are 0 volts. This shuts off transistors T61 and T62. Since transistors T61, T62 and T65 are OFF, transistors T63 and T64 are also OFF, and the output OUT of amplifier 100 is a high impedance (i.e. open-circuited).

The present invention is an improvement over the prior art amplifiers because of the use of PMOS devices in the penultimate stage S5. In an exemplary embodiment of the present invention, PMOS differential amplifier stage S5 is a low gain (i.e., Gm/Gm=1) amplifier that drives the simple differential amplifier in output stage S6. Thus, the gates of transistors T63 and T64, the differential transistor pair in stage S6, are referenced to ground by the diode connected PMOS load transistors T51 and T52 in stage S5. Since the gates of the differential transistor pair in stage S6 are referenced to ground rather than the supply voltage, the compliance range of amplifier 100 is not susceptible to the DC supply voltage variations that detrimentally affect the prior art amplifiers that incorporate only cascaded NMOS differential amplifier stages.

Although the present invention has been described in detail, those skilled in the art should understand that they can make various changes, substitutions and alterations herein without departing from the spirit and scope of the invention in its broadest form.

What is claimed is:

1. An amplifier comprising:
   a plurality of cascaded NMOS differential amplifier stages, wherein a first one of said plurality of cascaded NMOS differential amplifier stages is coupled to at least one input signal;
   a PMOS differential amplifier stage having a first input coupled to a first NMOS differential output of a last one of said plurality of cascaded NMOS differential amplifier stages and a second input coupled to a second NMOS differential output of said last cascaded NMOS differential amplifier stage, wherein said PMOS differential amplifier comprises a first diode-connected PMOS load transistor having a gate and a drain connected to ground and a second diode-connected PMOS load transistor having a gate and a drain connected to ground; and
   an output differential amplifier stage comprising:
      load transistors comprising a first PMOS transistor having a gate and a drain connected together and a source connected to a power supply rail and a second PMOS transistor having a gate coupled to said third PMOS transistor gate and a source connected to said power supply rail; and
      a first differential transistor pair comprising a first NMOS transistor having a gate coupled to a source of said first diode-connected PMOS load transistor and a drain coupled to a drain of said first PMOS transistor and a second NMOS transistor having a gate coupled to a source of said second diode-connected PMOS load transistor and a drain coupled to a drain of said second PMOS transistor.

2. The amplifier as set forth in claim 1 wherein said output differential amplifier stage further comprises a reference current source coupled to a source of said first NMOS transistor and a source of said second NMOS transistor.

3. The amplifier as set forth in claim 2 wherein said reference current source comprises a third NMOS transistor having a drain coupled to said source of said first NMOS transistor and said source of said second NMOS transistor, a source coupled to ground, and a gate coupled to a bias voltage.

4. The amplifier as set forth in claim 1 wherein a second one of said plurality of cascaded NMOS differential amplifier stages comprises:
   load transistors comprising a first diode-connected NMOS transistor having a first terminal connected to said power supply rail and a second diode-connected NMOS transistor having a first terminal connected to said power supply rail; and
   a differential transistor pair comprising a third NMOS transistor having a gate coupled to a non-inverting output of a preceding cascaded NMOS differential amplifier stage and a drain coupled of a second terminal of said first diode-connected NMOS load transistor and a fourth NMOS transistor having a gate coupled to an inverting output of a preceding cascaded NMOS differential amplifier stage and a drain coupled to a second terminal of said second diode-connected NMOS load transistor.

5. The amplifier as set forth in claim 4 wherein said second cascaded NMOS differential amplifier stage further comprises a reference current source coupled to a source of said third NMOS transistor and a source of said fourth NMOS transistor.

6. The amplifier as set forth in claim 5 wherein said reference current source comprises a fifth NMOS transistor having a drain coupled to said source of said third NMOS transistor and said source of said fourth NMOS transistor, a source coupled to ground, and a gate coupled to a bias voltage.

7. The amplifier as set forth in claim 1 wherein said PMOS differential amplifier stage has a gain approximately equal to 1.

8. An amplifier comprising:
   a plurality of cascaded NMOS differential amplifier stages, wherein a first one of said plurality of cascaded NMOS differential amplifier stages is coupled to at least one input signal;
   a PMOS differential amplifier stage having a first input coupled to a first NMOS differential output of a last one of said plurality of cascaded NMOS differential amplifier stages and a second input coupled to a second NMOS differential output of said last cascaded NMOS differential amplifier stage, wherein said PMOS differential amplifier comprises a first diode-connected PMOS load transistor having a gate and a drain connected to ground and a second diode-connected PMOS load transistor having a gate and a drain connected to ground; and
   an output differential amplifier stage having an inverting input coupled to a source of said fist diode-connected PMOS load transistor and a non-inverting input coupled to a source of said second diode-connected PMOS load transistor.

9. The amplifier as set forth in claim 8 wherein a second one of said plurality of cascaded NMOS differential amplifier stages comprises:
   load transistors comprising a first diode-connected NMOS transistor having a first terminal connected to said power supply rail and a second diode-connected NMOS transistor having a first terminal connected to said power supply rail; and
   a differential transistor pair comprising a first NMOS transistor having a gate coupled to a non-inverting output of a preceding cascaded NMOS differential amplifier stage and a drain coupled of a second terminal of said first diode-connected NMOS load transistor and a second NMOS transistor having a gate coupled to an inverting output of a preceding cascaded NMOS differential amplifier stage and a drain coupled to a second terminal of said second diode-connected NMOS load transistor.

10. The amplifier as set forth in claim 9 wherein said second cascaded NMOS differential amplifier stage further comprises a reference current source coupled to a source of said first NMOS transistor and a source of said second NMOS transistor.

11. The amplifier as set forth in claim 10 wherein said reference current source comprises a third NMOS transistor having a drain coupled to said source of said first NMOS transistor and said source of said second NMOS transistor, a source coupled to ground, and a gate coupled to a bias voltage.

12. The amplifier as set forth in claim 8 wherein said PMOS differential amplifier stage has a gain approximately equal to 1.

* * * * *